United States Patent [19]
Alexander

[11] Patent Number: 4,743,895
[45] Date of Patent: May 10, 1988

[54] CAPACITIVE SWITCHES

[75] Inventor: Peter W. Alexander, Exning, England

[73] Assignees: Phosphor Products Co. Ltd., Poole; TI Corporate Services Limited, Birmingham, both of England

[21] Appl. No.: 720,309

[22] Filed: Apr. 5, 1985

[30] Foreign Application Priority Data

Apr. 5, 1984 [GB] United Kingdom ............... 8408847

[51] Int. Cl.$^4$ .............................................. G09G 3/00
[52] U.S. Cl. .............................. 340/712; 340/365 C; 340/706
[58] Field of Search ............ 340/365 R, 365 C, 365 S, 340/706, 711, 712; 200/DIG. 1; 361/278, 280, 283, 330, 303

[56] References Cited

U.S. PATENT DOCUMENTS

| | | | |
|---|---|---|---|
| 3,921,167 | 11/1975 | Fox | 340/365 C |
| 3,971,013 | 7/1976 | Challoner et al. | 340/365 C |
| 4,186,392 | 1/1980 | Holz | 340/365 C |
| 4,280,121 | 7/1981 | Crask | 340/365 C |
| 4,290,061 | 9/1981 | Serrano | 340/365 C |
| 4,379,287 | 4/1983 | Tyler et al. | 200/DIG. 1 |
| 4,380,040 | 4/1983 | Posset | 200/DIG. 1 |
| 4,561,002 | 12/1985 | Chiu | 340/365 R |

FOREIGN PATENT DOCUMENTS

| | | |
|---|---|---|
| 0064240 | 11/1982 | European Pat. Off. |
| 2503493 | 10/1982 | France. |
| 1464095 | 2/1977 | United Kingdom. |
| 2002522 | 2/1979 | United Kingdom. |
| 1553563 | 10/1979 | United Kingdom. |
| 2061004 | 5/1981 | United Kingdom. |
| 2071338 | 9/1981 | United Kingdom. |
| 2080536 | 2/1982 | United Kingdom. |
| 2090979 | 7/1982 | United Kingdom. |

Primary Examiner—John W. Caldwell, Sr.
Assistant Examiner—Alvin Oberley
Attorney, Agent, or Firm—Solon B. Kemon

[57] ABSTRACT

A capacitive switch is formed of a dielectric layer having a first electrode disposed on or adjacent one surface and a second electrode and a conductive pad, such as a touch pad, disposed on the opposite side of the dielectric layer. The conductive pad and the second electrode are in superimposed relationship to the first electrode. The conductive pad and second electrode may be side by side, with a small gap between or they may be superimposed on one another with a further dielectric layer between. Such switches may be formed into an array and may be combined with a display by being superimposed over a display medium, such as an electroluminescent layer, having a display electrode on one side and the first electrode on the other side. In this arrangement all the components, except the display medium and the display electrode, are of transparent material.

25 Claims, 2 Drawing Sheets

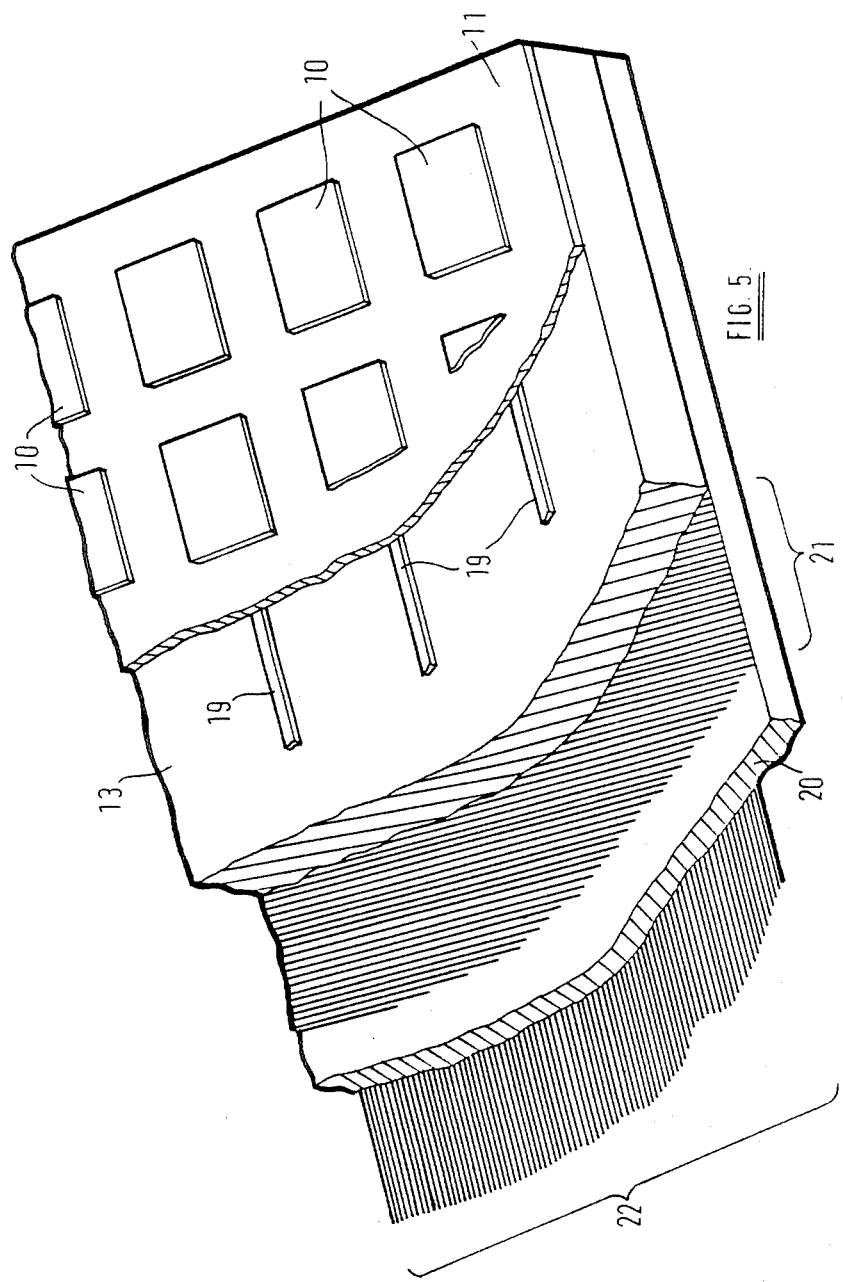

CAPACITIVE SWITCHES

The present invention relates to capacitive switches.

According to one aspect of the present invention a capacitive switch includes a first electrode disposed on or adjacent one surface of a layer of dielectric material, a second electrode and conductive pad both disposed on the opposite side of the layer of dielectric material from the first electrode and in superimposed relationship with the first electrode, said first and second electrodes and conductive pad being arranged so that the switch may be switched between first and second states, in one of which states the signal transfer factor between the first and second electrodes is significantly different from the signal transfer factor in the other of the two states.

The conductive pad and second electrode may be arranged side by side with a small gap therebetween or may be superimposed upon one another with a further layer of dielectric material therebetween. The appropriate balance in capacitive coupling between the first and second electrode by the direct route and via the conductive pad may be achieved by suitable adjustment of the areas (A) of overlap between the various electrodes, the separation (d) between the various electrodes and/or the dielectric constants (k) of the dielectric layers between the various electrodes.

Preferably the ratio:

$$\frac{Ak/d \text{ for conductive pad to first electrode}}{Ak/d \text{ for first electrode to second electrode}}$$

is 8:1 or more and more preferably is of the order of 40:1. The desired ratio may conveniently be achieved by making the conductive pad and first electrode of substantially equal dimensions but reducing the width of the second electrode by a ratio of 8:1 or more.

The direct capacitive coupling between the conductive pad and first electrode is preferably of the same order as that between the conductive pad and second electrode and the ratio of capacitive coupling more preferably falls between 1:2 and 2:1.

The conductive pad may be formed in fixed relationship to the first and second electrodes. With this arrangement the first electrode is capacitively coupled to the second electrode via the conductive pad, so that when an electrical load is applied to the conductive pad by, for example, touching or earthing the pad either directly or capacitively, the coupling via the conductive pad is effectively interrupted. As a result there will be a significant reduction in the capacitive coupling between the first and second electrodes. If a read signal is applied to one of said electrodes, this change in capacitance will result in a change in the amplitude of the output signal on the other electrode. This change in amplitude may be detected and used for switching purposes.

In an alternative embodiment the conductive pad is isolated from the person actuating the switch and from earth, but is mounted resiliently, so that it may be moved towards the first electrode to actuate the switch. With this arrangement coupling of the first electrode to the second electrode, via the conductive pad, will increase as the conductive pad moves towards the first electrode. As a result the effective capacitance of the switch will increase significantly upon actuation of the switch, with a corresponding change in the output signal which may again be detected and used for switching purposes.

Preferably, the signal transfer factor of the switch varies by a factor of at least two, between the actuated and non-actuated condition of the switch.

Capacitive switches of the construction described above are particularly suitable for forming arrays of switches.

According to a further aspect of the present invention an array of capacitive switches comprises a plurality of switches as described hereinbefore, the dielectric layer of each switch being formed by a common dielectric panel, the switches being formed in spaced apart relationship on the panel.

Preferably, the capacitive switches are arranged in m rows of n switches. The second electrodes of all switches in each row may be formed by a common conductive strip and the first electrodes of one switch from each row are formed by a common conductive strip. In this manner, the second electrodes for the full array of switches may be provided by m conductive strips and the first electrodes by n conductive strips, these conductive strips being arranged such that each switch has a unique combination of first and second electrodes. For example, the conductive strips providing the second electrodes may be aligned with one another and at right angles to the conductive strips providing the first electrodes.

The array of switches described above may be multiplexed in the manner disclosed in British Patent No. 2059657B.

If the conductive pads, first and second electrodes and layers of dielectric material of the switches or array of switches described above are made of transparent materials, the switches may be combined with a display as disclosed in British Patent No. 2002522B. Preferably, the display used will comprise a display medium which is disposed between a pair of electrodes or sets of electrodes, the display medium reacting to an electric field established between the electrodes to provide a display. Such displays include direct current electroluminescent displays, alternating current electroluminescent displays, liquid crystal displays, plasma displays, electrochromic displays and electrophoretic displays. These displays may be arranged to provide a fixed display which is either off or on, or alternatively a variable display which may be altered by actuation of the switch or of other switches in, for example, an array of switches. With these displays, the transparent electrodes on the front of the display may be used as the first electrodes for the capacitive switches. Each first electrode may be formed by a plurality of display electrodes provided that all the display electrodes may be addressed together for switch sensing purposes. When display electrodes are used as the first electrodes, it is advantageous to use these electrodes as read electrodes, so that the display driving circuit may be adapted to apply a read signal to the electrodes.

According to yet a further embodiment of the invention, a capacitive switch/display unit includes a capacitive switch or array of capacitive switches as described hereinbefore, the components of said capacitive switch or switches being made of transparent material, a display medium disposed on the rear surface of the or each first electrode and a display electrode disposed on the rear surface of the display medium, in superimposed relationship to the or each capacitive switch.

Normally, the form of display described above would be provided with a transparent cover, for example a glass plate, over the front of the display. Capacitive switch display units according to the present invention may consequently be formed by applying a transparent overlay to a preformed display unit. This overlay will comprise one or more conductive pads and a second electrode corresponding to the or each conductive pad mounted on a transparent dielectric or insulating layer. Alternatively the conductive pad and second electrode may be formed directly onto the front cover of an existing display unit.

The front cover and front electrodes of the display will then provide the remaining components of the switch or switches. Where the capacitive switch/display units form an array, the displays may be multiplexed in similar manner to the capacitive switches.

Various embodiments of the invention are now described by way of example only, with reference to the accompanying drawings, in which:

FIG. 5 illustrates diagrammatically in part section a touch switch/ display array according to the present invention.

Figure 1:
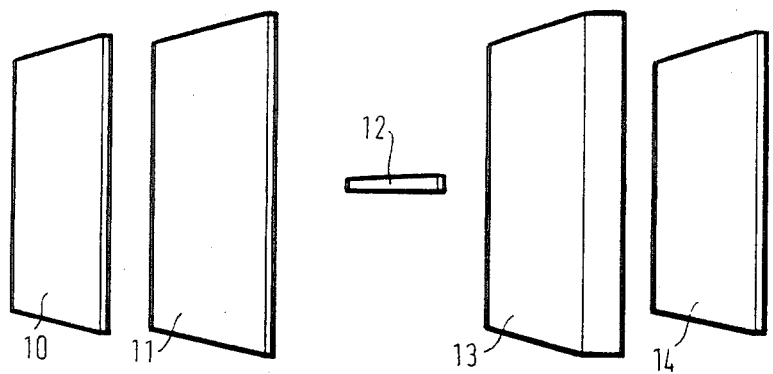
FIG. 1 illustrates diagrammatically a touch switch formed in accordance with the present invention.

In FIG. 1, a touch pad 10 of conductive material is deposited on the front surface of a layer 11 of dielectric material, such as glass or plastics. A narrow conductive strip sense electrode 12, of area substantially less than the touch pad 10, is deposited on the rear surface of the dielectric layer 11 or the front surface of a thick layer 13 of dielectric material. A conductive read electrode 14 of similar area to the touch pad 10, is formed on the rear surface of the dielectric layer 13, the electrodes 10, 12 and 14 being in superimposed relationship. A connection 15 is provided on the read electrode 14 (FIG. 2) for connection to circuitry by which electrical "read" pulses may be supplied thereto.

Figure 2:
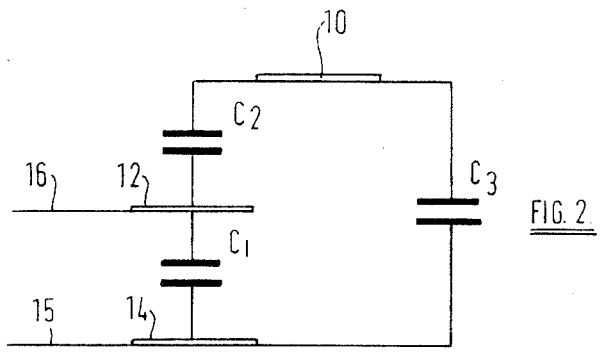
FIG. 2 shows the electrical circuit equivalent to the switch illustrated in FIG. 1.

When no electrical load is applied to the touch pad 10, the sense electrode 12 is coupled capacitively to the read electrode 14 both directly and via the touch pad 10, as in FIG. 2. The area of the sense electrode 12 relative to the touch pad 10 and read electrode 14, and the thickness and dielectric constants of the dielectric layers 11 and 13 are selected such that the capacitance between the read electrode 14 and sense electrode 12 via the touch pad 10, $$ie \frac{C_2 C_3}{C_2 + C_3}$$

is at least of the order of the capacitance $C_1$ directly between the read electrodes 14 and sense electrodes 12. In this condition the effective capacitance of the switch is:

$$C_E = C_1 + \frac{C_2 C_3}{C_2 + C_3}$$

When a person touches the pad 10, the electrical load thereon effectively interrupts the coupling of the electrode 14 to the sense electrode 12 via the touch pad 10. The effective capacitance of the switch becomes:

$$C_E = C_1$$

Typically, the touch pad 10 and read electrode 14 are 12.7 mm×9.525 mm and the sense electrode 12 is 1.0 mm×12.7 mm. The dielectric layers 11 and 13 are of glass sheet having a dielectric constant 7.5 and 0.5 mm and 3 mm thick respectively. With this arrangement the effective capacitance of the switch $C_E$ with no load applied was found to be 1.6 pF which fell to 0.8 pF when a load was applied to the touch pad 10.

The changing capacitance when a load is applied to the touch pad 10 produces a corresponding change in the output signal on the sense electrode 12. A connector 16 connects the electrode 12 to circuitry suitable for sensing the change in the output signal and initiating a switching action in response to such a change.

Instead of forming the switch from discrete layers 11 and 13 of dielectric material as described above, the sense and read electrodes 12 and 14 may be deposited on the front and rear surfaces of the dielectric layer 13 by, for example vapour deposition. A film of glass or plastics material, about 0.125 mm thick, may be then deposited on top of the sense electrode 12 to form dielectric layer 11 by, for example, dipping or spraying. The touch pad 10 may then be deposited on top of the glass or plastics film, to provide a switch of unitary construction.

Figure 3:
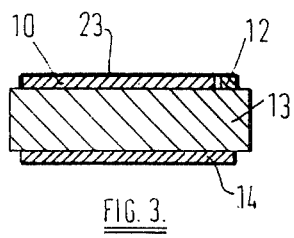
FIGS. 3 and 4 illustrate, in cross section, alternative constructions of touch switch formed in accordance with the present invention.

In FIG. 3 the touch pad 10 and sense electrode 12 are formed side by side on the front surface of the dielectric layer 13. The read electrode 14 is formed on the rear surface of the dielectric layer 13 as described above but is of enlarged area so as to overlap both the touch pad 10 and sense electrode 12. The pad 10 and electrode 12 may be protected by a thin layer of insulating material 23, for example glass or plastics material, produced in the manner described above.

Typically, the touch pad 10 is 12.7 mm×9.5 mm, the sense electrode 12 is 0.125 mm×12.7 mm and the gap between them is 0.05 mm. With glass 3 mm thick of a dielectric constant 7.5. the effective capacitance of the switch varies from 1.6 pF when untouched to 0.8 pF when touched.

Figure 4:
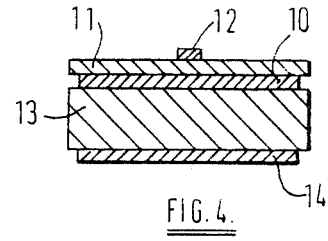

FIG. 4 is identical to FIG. 1 except that the positions of the electrodes 10 and 12 are reversed.

Because of the relative sizes of the sense electrode 12 and touch pad 10, although the sense electrode 12 is uppermost, touching of the upper surface of the switch will apply an electrical load to the touch pad 10 which will interrupt capacitive coupling between the read electrode 14 and sense electrode 12 via the touch pad 10, as described with reference to FIGS. 1 and 2. Furthermore, with this arrangement the touch pad 10 will shield the sense electrode 12 from direct capacitive coupling with the read electrode 14 and consequently when touched, the effective capacitance of the switch should be approximately zero.

The touch switch/display array illustrated in FIG. 5 is based on a dot matrix DC electroluminescent display, using the construction of FIG. 1. This display includes the glass panel 13 on the rear of which is a set of parallel elongate electrodes 21. A layer 20 of phosphor is applied over the rear of the electrodes 21 and a second set of elongated electrodes 22 are applied to the rear surface of the phosphor layer 20 at right angles to the electrodes 21. Each electrode of one set thus overlapping all of the electrodes of the other set, to form a dot matrix. Typically, the sets of electrodes 21 and 22 may contain between twenty and forty electrodes per centimeter. Electrodes 10, 19 and 21 are transparent, for example tin oxide, and the dielectric material 11 and 13 is transparent.

The electrodes 21 and 22 are provided with input connections for the application of voltage pulses individually to each electrode. Typically, the phosphor layer 20 will have an illumination threshold of from 80 to 120 volts and the voltage pulse applied to the electrodes 21 may be from 40 to 60 volts while the lses applied to electrodes 22 may be from −40 to −60 volts.

Thus wherever a pulsed electrode 21 crosses a pulsed electrode 22 that portion of the phosphor layer 20 between them will be excited and will produce an illuminated dot. By applying pulses simultaneously to appropriate pairs of electrodes 21 and 22, a plurality of dots may be illuminated at the same time to form a legend or symbol, which may be altered by applying pulses to different pairs of electrodes 21 and 22. Typically, these illumination pulses will have a duration of from 10 to 100 microseconds and be applied to the electrodes 21 and 22 at a frequency of 0.05 to 2 kHz, while the display is illuminated.

The sense electrodes 19 are in the form of parallel strips at right angles to the electrodes 21. The thin sheet 11 of dielectric material is disposed over the conductive strips 19, and a plurality of touch pads 10 are provided on the front surface of the sheet 11. The touch pads 10 are arranged in rows, each row overlapping a different one of the conductive strips 19 and in columns, each column overlapping a different group of electrodes 21.

The conductive strips 19 are provided with connectors at one edge of the switch/display array by means of which they may be connected to suitable sensing circuitry.

Consequently, by applying an electrical "read" pulse in turn to each group of electrodes 21 while all the other electrodes 21 are at zero potential and monitoring the output on each conductive strip 19, each switch in the array may be interrogated individually.

In order that the switch may be distinguished, when actuated, from all the other switches in a row served by a common sense electrode strip 19, the capacitive coupling between each touch pad 10 and strip 19 should be substantially less than the body capacitance of the person touching the switch (that is about 80 pF minimum, for an adult). Preferably, the capacitance between each touch pad 10 and sense electrode strip 19 will be less than 10 pF. Also in order to avoid excessive attenuation of the output signal due to the increasing resistance of the sense electrode strip 19 along the row of switches, which may result in false switching signals, the overall resistance of each of the sense electrode strips 19 should not exceed 100 k ohms.

Conveniently, the circuitry to apply illumination pulses to the electrodes 21 may also be used to apply read pulses, but instead of pulsing individual electrodes as required for illumination purposes, the circuitry will be arranged to pulse all the electrodes 21 in one group simultaneously. These read pulses will be applied between the illumination pulses and will typically be of the order of 10 microsecond duration at a frequency of 50 Hz. As no pulses will be applied to the electrodes 22 when the read pulses are applied to the electrodes 21, the potential across the phosphor layer will not reach the illumination threshold and consequently the display will not be affected.

The switch/display array described above may be arranged such that separate display areas are associated with the overlying switches. These displays may be varied as desired in response to actuation of the switch or other switches in the array, thus providing an array of programmable multi-functional switches. With this mode of operation, only electrodes 21 and 22 underlying the touch pads 10 will be used for illumination purposes. Alternatively, the whole panel may be used to provide a single display, the actuation of the switches producing effects associated with the underlying region of the display.

The touch pads 10 and conductive strips 19 described above may be deposited on the glass or plastic sheet 11 to form an overlay which may be applied to the glass cover screen of an existing array, to provide a switch/display array of the form described.

While we have described, with reference to FIG. 5, a touch switch/display array, individual switch/display units may be formed in this manner.

Various modifications may be made without departing from the invention. For example, in the embodiments described above, switching is achieved by an electrical load being applied to the touch pads 10, normally by a person touching that touch pad 10. This has the drawback that the load applied will vary from person to person and the sensing circuit must be capable of operating over a fairly wide range. A more consistent change in signal may be achieved by providing means for connecting the pad 10 directly to earth.

The switches or arrays of switches described above may be provided with resilient membranes which are spaced away from the front surface of the switch and which must be depressed to actuate the switch. Such membranes will provide tactile feed-back and also prevent conductive fluids reaching the surface of the switches and with an array of switches bridge the touch pads 10 of two or more switches. Where the switch functions as a touch switch the membrane may be made of conductive material or may have a conductive coating on its inner surface, this coating being connected to earth so that when the switch is actuated the touch pad 10 will be earthed. This latter arrangement has the advantage that the switch may be actuated using a non-conductive stylus or gloved finger. Where the switch has a moveable conductive pad, this may be formed on the inner surface of the membrane. Membranes of the type described above may be formed from flat resilient sheet material which is separated from the front face of the switch by spacers. However, the membrane may conveniently be formed from sheet with a blister formation which overlies the switch. With arrays of switches a single sheet moulded with a plurality of blister formations, one for each switch, may cover the whole of the array. Such membranes may also be used with switch/display units provided that they are made of transparent material. With switch/display units the transparent dielectric layers 11 and 13 and/or membrane (where used), may be tinted in order to enhance or vary the natural appearance of the display. The disposition of the touch pads 10 and sense electrodes 12 shown in FIGS. 3 and 4 may be used in FIG. 5 instead of the disposition shown therein.

The accompanying drawings are diagrammatic illustrations only and are not intended to indicate the relative dimensions and particularly thicknesses of the components. Typically, the first dielectric layer 11 will be of the order of 1 mm thick; the second dielectric layer 13 of the order of 3 mm thick; the phosphor layer of the order of 40 microns thick; and the touch pads 10 and various electrodes 12, 14, 19, 21 and 22 of the order of 0.05 microns thick.

In FIG. 5, the phosphor layer 20, associated electrodes 21, 22 and glass panel 13 may constitute an existing display unit. In this case the dielectric sheet 11, touch pads 10 and sense electrodes 19 may constitute a separate capacitive switch overlay, adapted to fit onto the display unit such that the touch pads 10 and electrodes 19 are superimposed on the first electrodes 21. With the disposition of touch pads 10 and sense electrodes 12 shown in FIG. 3, they would both be on the same side of the dieletric sheet 11 of the overlay.

The expression "signal transfer factor" used herein means the ratio of the magnitude of a pulse appearing on one of said first and second electrodes in response to a pulse applied to the other electrode, to the magnitude of the pulse applied to said other electrode.

I claim:

1. A combined capacitive switch and display unit, comprising:
   a layer of dielectric material;
   a first electrode disposed adjacent one surface of the layer of dielectric material;
   a second electrode disposed on the opposite side of the layer of dielectric material from the first electrode and in superimposed relationship with the first electrode;
   a conductive pad disposed on the opposite side of the layer of dielectric material from the first electrode and in superimposed relationship with the first electrode said first and second electrodes and said conductive pad being arranged so that the switch may be switched between first and second states, in one of said first and second states a signal transfer factor between the first and second electrodes being significantly different from the signal transfer factor in the other of said first and second states, the conductive pad and the layer of dielectric material being made from transparent materials;
   a display medium disposed on the rear surface of the first electrode; and
   a display electrode disposed on the rear surface of the display medium, in superimposed relationship to the first electrode, wherein the display medium provides a display in response to an electric field which may be established between the first electrode and the display electrode.

2. A combined switch display unit as claimed in claim 1 in which the conductive pad and second electrode are superimposed upon one another, a further layer of dielectric material being interposed therebetween.

3. A combined capacitive switch display unit as claimed in claim 1 in which the conductive pad and second electrode are arranged side by side with a small gap therebetween.

4. A combined capacitive switch and display unit as claimed in claim 1 in which the ratio of a quotient Ak/d between the conductive pad and the first electrode to a quotient Ak/d between the first and second electrodes is 8:1 or more, wherein A is the area of overlap of the respective electrodes, k is the dielectric constant between the respective electrodes and d is the separation between the various electrodes.

5. A combined capacitive switch display unit as claimed in claim 4 in which the ratio of the quotient Ak/d between the conductive pad and first electrode to the quotient Ak/d between the first and second electrodes is of the order of 40:1.

6. A combined capacitive switch display unit as claimed in claim 4 in which the ratio of the width of the conductive pad and of the first electrode to the width of the second electrode is 8:1 or more.

7. A combined capacitive switch display unit as claimed in claim 1 in which the direct capacitive coupling between the conductive pad and the first electrode is of the same order as the direct capacitive coupling between the conductive pad and the second electrode.

8. A combined capacitive switch display unit as claimed in claim 7 in which the ratio of direct capacitive coupling between the conductive pad and first electrode and between the conductive pad and second electrode is between 1:2 and 2:1.

9. A combined capacitive switch display unit as claimed in claim 1 in which the conductive pad is disposed in fixed relationship to the first and second electrodes.

10. A combined capacitive switch display unit as claimed in claim 1 in which the conductive pad is resiliently mounted so that it may be moved relative to the first electrode.

11. A combined capacitive switch and display unit as claimed in claim 1 in which the display medium is selected from an electroluminescent material, a liquid crystal, an ionizable gas, an electrochromic material or an electrophoretic material.

12. A combined capacitive switch and display unit as claimed in claim 1 including means for applying display drive signals between the first and display electrodes, means for applying read pulses to the first electrodes and means for sensing pulses transmitted capacitively to the second electrodes.

13. A capacitive switch and display unit as claimed in claim 12 in which the means for applying display drive signals also serves to apply read pulses to the first electrodes.

14. A combined capacitive switch and display unit as claimed in claim 1 including a display unit having the display medium disposed between the first electrode and the display electrode arranged in superimposed relationship and a cover of transparent dielectric material disposed in front of thefirst electrode, and including a capacitive switch overlay comprising a transparent sheet of dielectric material with the conductive pad and second electrode formed thereon from a transparent conductive material, said switch overlay being applied to the front surface of the display cover so that the conductive pad and second electrode are superimposed on the first electrode.

15. A combined array of capacitive switches and a display unit, each of the capacitive switches comprising:
   a layer of dielectric material;
   a first electrode disposed adjacent one surface of the layer of dielectric material;
   a second electrode disposed on the opposite side of the layer of dielectric material from the first electrode and in superimposed relationship with the first electrode;
   a conductive pad disposed on the opposite side of the layer of dielectric material from the first electrode and in superimposed relationship with the first electrode, said first and second electrodes and said conductive pad being arranged so that the switch may be switched between first and second states, in one of said first and second states a signal transfer factor between the first and second electrodes being significantly different from the signal transfer factor in the other of said first and second states, the conductive pad and the layer of dielectric material being made from transparent materials;

the display unit comprising:

a display medium disposed on the rear surface of the first electrodes of the array of switches; and a display electrode means disposed on the rear surface of the display medium, the display electrode means comprising a plurality of elongate display electrodes;

wherein the first electrodes of the array of switches are also elongate and disposed so that each of said first elecrodes overlaps the elongate display electrodes and vice versa whereby the display medium provides a display in response to an electric field established between overlapping ones of said first and elongate display electrodes.

16. An array as claimed in claim 15 in which the second electrodes of a group of switches are provided by a common conductive strip.

17. An array as claimed in claim 15 in which the first electrodes of a group of switches are provided by a common conductive strip.

18. An array as claimed in claim 15 in which the switches are arranged in a plurality of rows, all the switches in each row having second electrodes formed by a common conductive strip and the first electrodes of one switch from each row formed by a common conductive strip.

19. An array as claimed in claim 18 in which the conductive strips providing the second electrodes for each row of switches are arranged at right angles to the conductive strips providing the first electrodes.

20. An array as claimed in claim 16 in which the capacitance between each conductive pad and the conductive strip forming the second electrodes is less than 10 pF.

21. An array as claimed in claim 16 in which the resistance of the conductive strip forming the second electrodes does not exceed 100 k ohms.

22. An array as claimed in claim 15 in which the display medium is selected from an electroluminescent material, a liquid crystal, an ionizable gas, an electrochromic material or an electrophoretic material.

23. An array as claimed in claim 15 including means for applying display drive signals between the first and display electrodes, means for applying read pulses to the first electrodes and means for sensing pulses transmitted capacitively to the second electrodes.

24. An array as claimed in claim 23 in which the means for applying display drive signals also serves to apply read pulses to the first electrodes.

25. An array as claimed in claim 15 wherein the display medium of the display unit is disposed between the first electrode and the display electrode arranged in superimposed relationship and a cover of transparent dielectric material is disposed in front of the first electrode, and including a capacitive switch overlay comprising a transparent sheet of dielectric material with the conductive pad and the second electrode formed thereon from a transparent conductive material, said switch overlay being applied to the front surface of the display cover so that the conductive pad and second electrode are superimposed on the first electrode.

* * * * *